(12) United States Patent
Bachman, II et al.

(10) Patent No.: US 7,259,630 B2
(45) Date of Patent: Aug. 21, 2007

(54) ELIMINATION OF PEAK CLIPPING AND IMPROVED EFFICIENCY FOR RF POWER AMPLIFIERS WITH A PREDISTORTER

(75) Inventors: Thomas A. Bachman, II, Darlington, MD (US); Breck W. Lovinggood, Garland, TX (US)

(73) Assignee: Andrew Corporation, Westchester, IL (US)

( * ) Notice: Subject to any disclaimer, the term of this patent is extended or adjusted under 35 U.S.C. 154(b) by 0 days.

(21) Appl. No.: 10/625,761

(22) Filed: Jul. 23, 2003

(65) Prior Publication Data

US 2005/0017801 A1 Jan. 27, 2005

(51) Int. Cl.
*H03F 3/04* (2006.01)

(52) U.S. Cl. ............ 330/297; 330/149; 330/127; 330/136; 330/2; 327/560; 327/355; 375/296; 375/297; 332/159; 332/160; 455/126; 455/127; 455/63

(58) Field of Classification Search .......... 330/297, 330/127, 149, 136, 2; 327/560, 355; 375/296, 375/297; 332/159, 160; 455/126, 127, 63
See application file for complete search history.

(56) References Cited

U.S. PATENT DOCUMENTS

| | | | |
|---|---|---|---|
| 3,241,078 A | 3/1966 | Jones | 329/50 |
| 3,689,752 A | 9/1972 | Gilbert | 235/194 |
| 4,156,283 A | 5/1979 | Gilbert | 364/841 |
| 4,870,371 A | 9/1989 | Gottwald et al. | 330/149 |
| 4,879,519 A | 11/1989 | Myer | 330/149 |
| 4,978,873 A | 12/1990 | Shoemaker | 307/498 |
| 5,023,565 A | 6/1991 | Lieu | 330/151 |
| 5,049,832 A | 9/1991 | Carvers | 330/149 |
| 5,115,409 A | 5/1992 | Stepp | 364/841 |
| 5,119,040 A | 6/1992 | Long et al. | |

(Continued)

FOREIGN PATENT DOCUMENTS

EP 0 085 600 A1 1/1983

(Continued)

OTHER PUBLICATIONS

Lohtia, Anit et al., "Power Amplifier Linearization using Cubic Spline Interpolation", *IEEE*, (1993), No. 0-7803-1266-x/93, pp. 676-679.

(Continued)

*Primary Examiner*—Michael B Shingleton
(74) *Attorney, Agent, or Firm*—Wood, Herron & Evans, L.L.P.

(57) ABSTRACT

A predistorer configured for use with an RF power amplifier having an input loop configured to be coupled to the input of the RF power amplifier and peak control circuit. Such an input loop includes a look-up table containing predistortion values to be applied to an input signal, in response to the power in the input signal, for forming a predistorted input signal. The predistorter may further include an output loop, such an output loop configured to measure an intermodulation distortion product of the RF power amplifier output resulting from the predistorted input signal, and operable to update the predistortion values in the look-up table. Such a peak control circuit configured to select a power supply voltage for the RF power amplifier in response to the power in the input signal.

45 Claims, 3 Drawing Sheets

U.S. PATENT DOCUMENTS

| | | | |
|---|---|---|---|
| 5,130,663 A | 7/1992 | Tattersall, Jr. | 330/52 |
| 5,323,119 A | 6/1994 | Powell et al. | 330/151 |
| 5,325,095 A | 6/1994 | Vadnais et al. | 342/22 |
| 5,414,383 A | 5/1995 | Cusdin et al. | 329/304 |
| 5,477,187 A | 12/1995 | Kobayashi et al. | 330/52 |
| 5,485,120 A | 1/1996 | Anvari | 330/151 |
| 5,491,454 A | 2/1996 | Matz | 330/149 |
| 5,528,196 A | 6/1996 | Baskin et al. | 330/151 |
| 5,594,385 A | 1/1997 | Anvari | 330/149 |
| 5,610,554 A | 3/1997 | Anvari | 330/52 |
| 5,617,061 A | 4/1997 | Fukuchi | 330/151 |
| 5,621,354 A | 4/1997 | Mitzlaff | 330/52 |
| 5,691,668 A | 11/1997 | Yoshikawa et al. | 330/151 |
| 5,699,383 A | 12/1997 | Ichiyoshi | |
| 5,732,333 A | 3/1998 | Cox et al. | 455/126 |
| 5,760,646 A | 6/1998 | Belcher et al. | 330/149 |
| 5,808,512 A | 9/1998 | Bainvoll et al. | 330/151 |
| 5,831,478 A | 11/1998 | Long | 330/52 |
| 5,862,459 A | 1/1999 | Charas | 455/114 |
| 5,867,065 A | 2/1999 | Leyendecker | 330/149 |
| 5,877,653 A | 3/1999 | Kim | 330/149 |
| 5,892,397 A | 4/1999 | Belcher et al. | 330/149 |
| 5,900,778 A | 5/1999 | Stonick et al. | 330/149 |
| 5,912,586 A | 6/1999 | Mitzlaff | 330/149 |
| 5,923,214 A | 7/1999 | Mitzlaff | 330/52 |
| 5,929,703 A | 7/1999 | Sehier et al. | 330/149 |
| 5,933,766 A | 8/1999 | Dent | 445/103 |
| 5,959,499 A | 9/1999 | Khan et al. | 330/149 |
| 5,963,090 A | 10/1999 | Fukuchi | |
| 5,970,053 A | 10/1999 | Schick et al. | |
| 5,986,499 A | 11/1999 | Myer | 330/52 |
| 6,046,635 A | 4/2000 | Gentzler | 330/149 |
| 6,047,177 A | 4/2000 | Wickman | |
| 6,052,023 A | 4/2000 | Myer | 330/2 |
| 6,072,364 A | 6/2000 | Jeckeln et al. | 330/149 |
| 6,075,411 A | 6/2000 | Briffa et al. | 330/149 |
| 6,078,216 A | 6/2000 | Proctor, Jr. | |
| 6,091,295 A | 7/2000 | Zhang | 330/149 |
| 6,091,715 A | 7/2000 | Vucetic et al. | 370/277 |
| 6,104,239 A | 8/2000 | Jenkins | 330/2 |
| 6,118,335 A | 9/2000 | Nielsen et al. | 330/2 |
| 6,118,339 A | 9/2000 | Gentzler et al. | 330/149 |
| 6,125,266 A | 9/2000 | Matero et al. | 445/126 |
| 6,137,335 A | 10/2000 | Proebsting | 327/281 |
| 6,141,390 A | 10/2000 | Cova | 375/297 |
| 6,144,255 A | 11/2000 | Patel et al. | 330/151 |
| 6,148,185 A | 11/2000 | Maruyama et al. | 455/115 |
| 6,154,641 A | 11/2000 | Zhang | 455/112 |
| 6,157,253 A | 12/2000 | Sigmon et al. | 330/10 |
| 6,175,747 B1 | 1/2001 | Tanishima et al. | |
| 6,208,846 B1 | 3/2001 | Chen et al. | 455/127 |
| 6,211,733 B1 | 4/2001 | Gentzler | 330/149 |
| 6,400,223 B1 | 6/2002 | McLaren | |
| 6,600,792 B2 | 7/2003 | Antonio et al. | |
| 6,714,073 B2 | 3/2004 | Suto et al. | |
| 6,788,151 B2 * | 9/2004 | Shvarts et al. | 330/297 |
| 2002/0101937 A1 | 8/2002 | Antonio et al. | |
| 2002/0146996 A1 | 10/2002 | Bachman, II et al. | |
| 2004/0136470 A1 * | 7/2004 | DeBruyn et al. | 375/297 |

FOREIGN PATENT DOCUMENTS

| | | |
|---|---|---|
| EP | 0 367 457 B1 | 3/1996 |
| EP | 0 998 026 A1 | 5/2000 |
| EP | 0 948 131 B1 | 3/2002 |
| GB | 2 347 031 A | 2/1999 |
| GB | 2369735 A | 5/2002 |
| GB | 2376584 A | 5/2002 |
| WO | WO97/08822 | 3/1997 |

OTHER PUBLICATIONS

Stapleton, Shawn P., "Amplifier Linearization Using Adaptive Digital Predistortion—The need for greater linearity can be addressed at the digital coding level", *Applied Microwave & Wireless*, Technical Feature, (Feb. 2001), pp. 72-77.

Vella-Coleiro, George, *Frequency-Dependent Phase Pre-Distortion for Reducing Spurious Emissions in Communication Networks*, U.S. Appl. No. 10/068,343, filed Feb. 5, 2002.

White, Paul E. et al., *Digital Baseband Receiver in a Multi-carrier Power Amplifier*, U.S. Appl. No. 10/091,756, filed Mar. 6, 2002.

DeBruyn, William P. et al., *An Uncorrelated Adaptive Predistorter*, U.S. Appl. No. 10/342,633, filed Jan. 15, 2003.

Leffel, Michael D., *Independence Between Paths That Predistort for Memory and Memory-less Distortion in Power Amplifiers*, U.S. Appl. No. 10/406,959, filed Apr. 3, 2003.

\* cited by examiner

ELIMINATION OF PEAK CLIPPING AND IMPROVED EFFICIENCY FOR RF POWER AMPLIFIERS WITH A PREDISTORTER

CROSS-REFERENCE TO RELATED APPLICATION

This application is related to the co-pending U.S. patent application Ser. No. 10/342,633, entitled AN UNCORRELATED ADAPTIVE PREDISTORTER, filed on Jan. 15, 2003 by William P. DeBruyn, et al., which application is incorporated by reference herein.

FIELD OF THE INVENTION

This invention relates generally to amplifiers, and more particularly to reducing clipping while improving efficiency in such amplifiers.

BACKGROUND OF THE INVENTION

Wireless communications services within a cellular network are provided through individual geographic areas or "cells." Historically, a cell site has generally included a cellular tower, having RF antennas that communicate with a plurality of remote devices, such as cellular phones and paging devices, and a base terminal station (BTS). A BTS typically includes one or more radio frequency (RF) power amplifiers coupled to the RF antennas for transmitting wireless communication signals to the remote devices. Cellular networks may provide services using digital modulation schemes. Such modulation schemes may include time division multiple access (TDMA), code division multiple access (CDMA), and Global System for Mobile communications (GSM), as well as others.

In a theoretical or an ideal RF power amplifier, the output power of the amplifier is equal to the input power of the amplifier multiplied by a constant (K), i.e., the amplification or gain factor, and does not vary with input power level. Moreover, the phase of the output signal is the same as the phase of the input signal. Practically, both the output power and phase vary as a function of the input signal.

Generally, an RF power amplifier has three operating regions. The first region, or linear region, includes operation where input signal power levels are relatively small and K remains constant. In the linear region, the response of an amplifier closely approximates that of an ideal amplifier. The second and third regions are referred to as non-linear regions. The second region or compression region begins where input power levels have increased to the point that K begins to reduce or roll-off with further increases in input power. The third region or saturation region is where the output power of the amplifier fails to increase with an increase in input power.

Transistor devices used in RF power amplifiers are coupled to a direct current (DC) power supply, and are biased, in part, based on the voltage of the DC power supply. The selection of the bias point or quiescent operating point of the transistor device also determines the efficiency and the distribution of intermodulation distortion products generated by the device, and thereby determines the spectral purity of signals amplified by the RF power amplifier.

Transistors particularly suited to operation in the 500 Megahertz (MHz) to 3.5 Gigahertz (GHz) range and that are typically used in RF power amplifiers in BTS are often lateral diffusion metal oxide semiconductor (LDMOS) devices. LDMOS devices offer excellent thermal characteristics due to advanced flange materials. Other suitable transistors may be GaAs, SiGe, SiC, and GaN devices.

In light of the foregoing, RF power amplifiers may be characterized and compared using their efficiency and spectral purity. RF power amplifiers may also be selected for a particular application based on their efficiency and spectral purity. Moreover, RF power amplifier suppliers often differentiate themselves based on efficiency and spectral purity.

Unfortunately, efficiency and spectral purity are typically mutually exclusive. For example, in order improve spectral purity the output power of the RF power amplifier must be reduced, causing an increase in the thermal dissipation of transistor devices in the RF power amplifier while the efficiency suffers. Conversely, in order to increase the output power and improve efficiency, the spectral purity of the RF amplifier often suffers.

Increased demands on the RF spectrum caused by continued increases in the number of wireless communications users require more spectrally efficient modulation schemes, such as the aforementioned digital modulation schemes, and more efficient RF power amplifiers for use therewith. Moreover, wireless devices used with cellular communications systems require high power efficiency for purposes of extending battery life. Thus, RF power amplifiers used in such systems are often operated close to or in a non-linear region to maximize efficiency.

Unfortunately, operation near a non-linear region may result in non-linear operation when digital modulation schemes having a fluctuating envelope are used. For example, operation in compression may result in distortion and spectral spreading into adjacent channels. The Federal Communications Commission (FCC), like other governing bodies, limits emissions in adjacent channels. Band broadening and/or an increase in the bit error rate may also result. Governing bodies typically limit out of band emissions as well. In some instances, the number of calls a system is capable of supporting may be reduced.

Techniques developed to reduce non-linearities in amplifiers may be categorized as either feed-forward, feedback or predistortion, each having their respective advantages and disadvantages. The feed-forward technique attenuates a portion of an RF power amplifier output signal so that it is the same level as the input signal. The difference between this distorted output signal and the input signal is used to generate an error signal. The error signal is then amplified and subtracted from the RF power amplifier output, improving the linearity of the RF power amplifier. Generally, feed-forward techniques are capable of handling multi-carrier signals, but do so at the expense of efficiency.

The feedback technique uses synchronously demodulated output signals as the feedback information, forming a feedback loop. These signals are subtracted from the input signals, generating loop error signals. If the feedback loop gain is sufficient, the loop error signals continuously correct any non-linearity in the RF power amplifier response. Generally, feedback techniques used with RF power amplifiers provide a reduction in out of band emissions, while being easily implemented. However, stability requirements limit bandwidth due to a dependence on loop delay. Thus, feedback techniques are of limited utility when used with certain modulation schemes.

The predistortion technique provides an appropriately distorted signal to the RF power amplifier, so that the RF power amplifier output is a scaled replica of the input signal. One type of predistorter uses a fixed signal predistortion circuit prior to amplification. A fixed type predistorter is of limited utility when used with digital modulation scheme having a fluctuating envelope, and does not account for changes, or drifts, in RF power amplifiers used therewith.

Another type of predistorter is an adaptive predistorter. In one adaptive predistorter the amplitude modulation to amplitude modulation (AM-AM) and the amplitude modulation to phase modulation (AM-PM) characteristics of an RF power amplifier are estimated, using cubic spline interpolation, from a look-up table of distortion values generated using synchronous demodulation from the RF power amplifier output. The estimated values are then used to predistort the input signal to the RF power amplifier. The performance of an adaptive predistorter is typically comparable with that of negative feedback and feed-forward techniques without being limited in the modulation scheme used or suffering from drift.

Generally, such an adaptive predistorter operates as follows. First, a digital signal or a baseband signal is encoded into in-phase (I) and quadrature-phase (Q) components. The I/Q components then pass through a pulse-shaping filter to ensure free-symbol-interference (FSI). The I/Q signals are then applied to a squaring circuit that produces a scalar value $(Vm)^2$ indicative of the power of the baseband input signal. The scalar value $(Vm)^2$ is then used as a pointer to a look-up table that contains predistortion values for the I/Q components. The predistortion values are then multiplied with the I/Q components, generating predistorted signals $I_d$ and $Q_d$, respectively. The predistorted signals $I_d$ and $Q_d$ are then converted to analog signals and applied to a quadrature modulator. The quadrature modulator, driven by an oscillator, generates a modulated RF signal that is applied to the RF power amplifier.

A portion of the RF power amplifier output is applied to a quadrature demodulator, driven by the same oscillator, to produce I/Q baseband signals. The I/Q baseband signals are converted into digital signals (I'/Q'). I'/Q' are then compared to I/Q, respectively, to estimate the AM-AM and AM-PM characteristics of the RF power amplifier. Since there is a delay in time between when the predistorted signals $I_d/Q_d$ are applied to the RF power amplifier and the time that digital signals I'/Q' are developed, the input signals I/Q must be delayed by that same amount of time before making the comparison. Thus, such a predistorter, in comparing I/Q signals, may be said to be "correlated" and "adaptive" in that the values in the look-up table change with time.

Such correlated adaptive predistorters may use cubic spline interpolation in estimating the AM-AM and AM-PM characteristics for values of $(Vm)^2$, using values stored in the look-up table. Accuracy equivalent to that afforded by cubic spline interpolation requires a high order polynomial for a single polynomial fit. Although the use or application of cubic spline interpolation avoids the need for higher order polynomials in linearizing the response of an RF power amplifier, such correlated adaptive predistorters are still complex and costly by virtue of the delay and demodulation circuits used therein.

Although predistortion is one technique that may be used to improve the spectral purity of a RF power amplifier without reducing the efficiency of the amplifier, one problem with predistortion is the improvement to spectral purity is quickly reduced, or thwarted, if clipping of the waveform occurs in the amplifier. For example, the waveforms typically associated with communications system using the IS-95, CDMA2000, and Universal Mobile Telecommunications System (UMTS) communications standards all may experience peak power levels that may be anywhere from 6 to 12 decibels (dB) greater than average power levels. As a result, a high probability of clipping RF power amplifier used in such systems exists.

There is a need to maintain spectral purity in a RF power amplifier in the presence of peak power clipping without sacrificing efficiency.

BRIEF DESCRIPTION OF THE DRAWINGS

The accompanying drawings, which are incorporated in and constitute a part of this specification, illustrate embodiments of the invention and, together with the detailed description given below, serve to explain the principles of the invention.

DETAILED DESCRIPTION OF THE DRAWINGS

Figure 1:
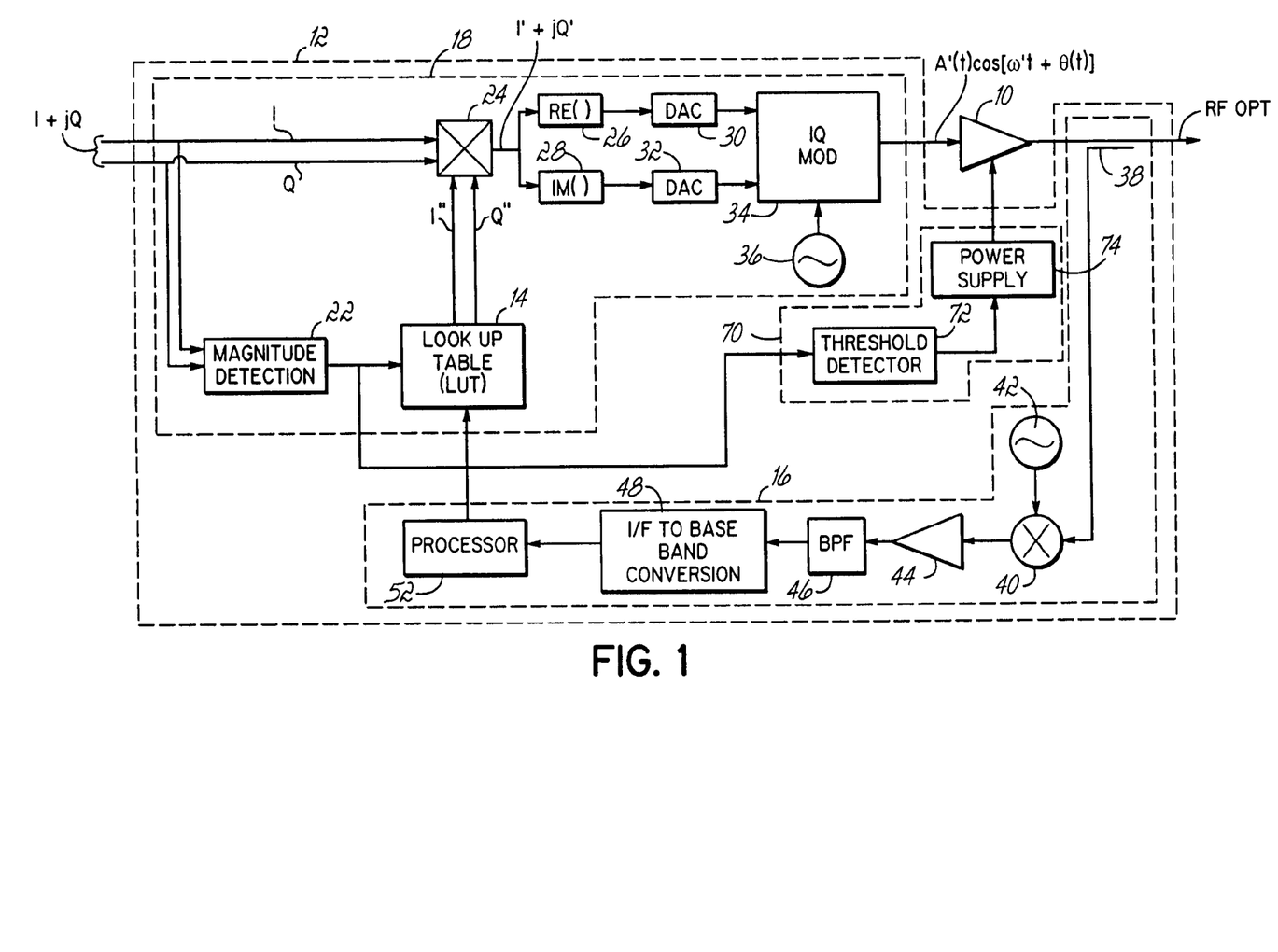
FIG. 1 is a schematic diagram of a first embodiment of an uncorrelated adaptive predistorter including a power supply control circuit in accordance with the principles of the present invention.
Figure 2:
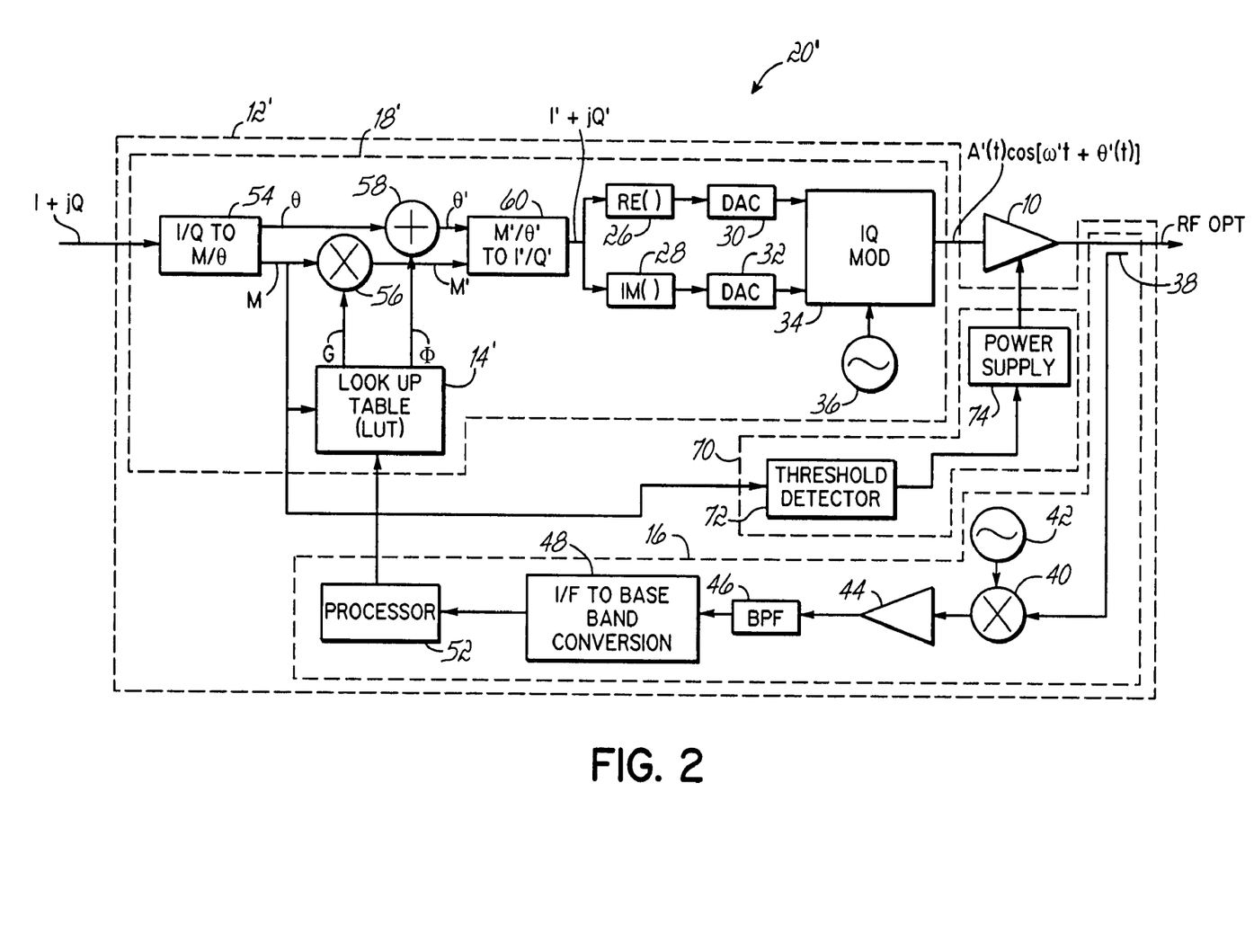
FIG. 2 is a schematic diagram of a second embodiment of an uncorrelated adaptive predistorter including a power supply control circuit in accordance with the principles of the present invention; and, FIG. 3 is a schematic diagram of a third embodiment of an uncorrelated adaptive predistorter including a power supply control circuit in accordance with the principles of the present invention.
Figure 3:
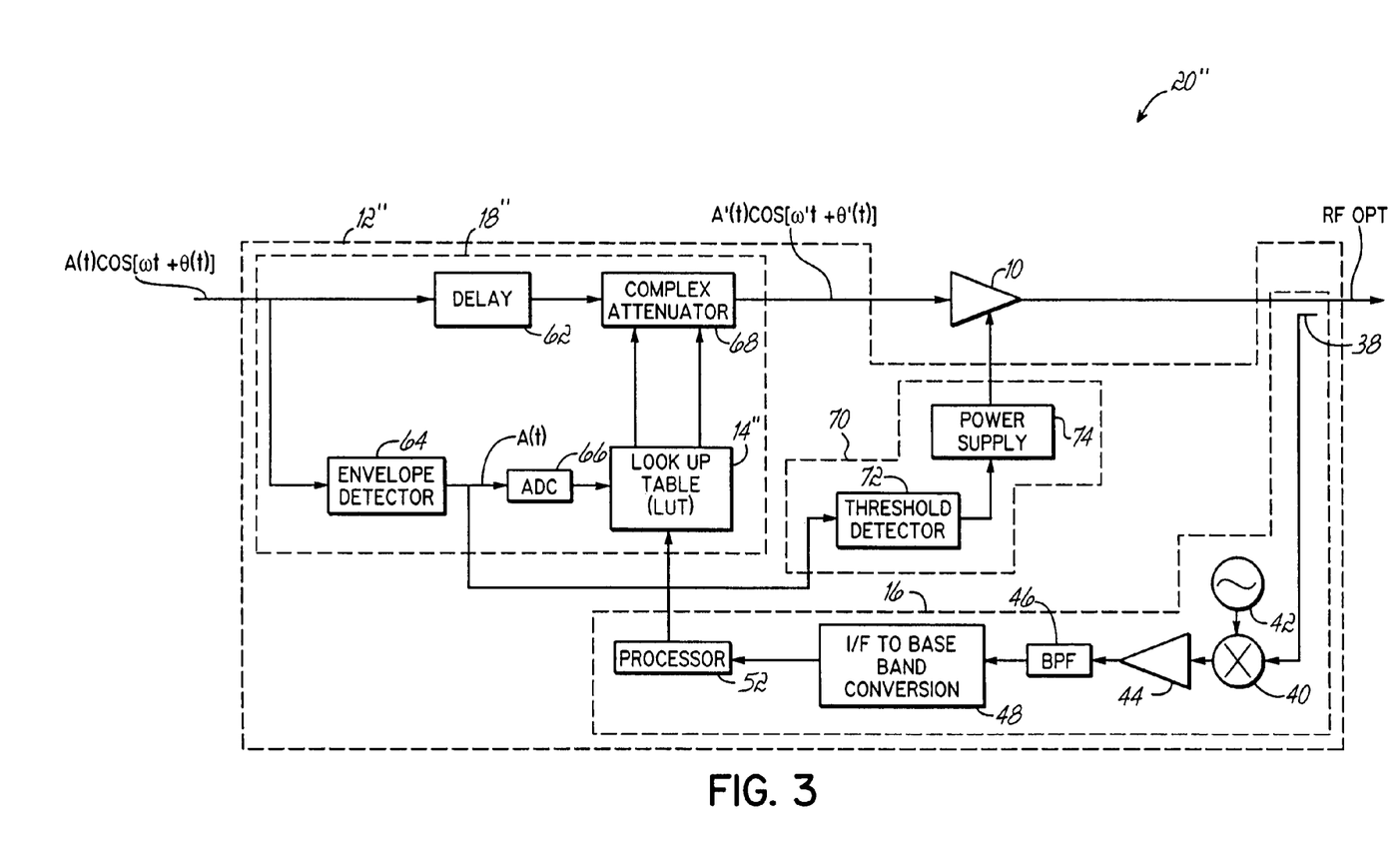

With reference to FIGS. 1–3, wherein like numerals denote like parts, there is shown an RF power amplifier and a predistorter including a peak control circuit for use therewith. The predistorter is configured to reduce non-linearities in the response of the RF power amplifier, thereby allowing an increase in efficiency, while the peak control circuit is configured to increase the power supply voltage to the RF power amplifier, thereby providing the RF power amplifier with the headroom necessary to provide peak instantaneous power demands without clipping. More specifically, the predistorter comprises an input loop including a digitally based look-up table (LUT) and an output loop that measures an intermodulation distortion (IMD) product of the RF power amplifier. A spline function is used to produce an optimal set of values in the LUT such that an IMD product of the RF power amplifier in the output loop is minimized. In addition, the peak control circuit may be further configured to reduce the power supply voltage in low power operation.

Referring now to FIG. 1, a first embodiment 20 of an amplifier system comprises an RF power amplifier 10 and a predistorter 12 including a peak control circuit 70. RF power amplifier 10 is typical of RF power amplifiers known to those skilled in the art having linear, compression, and saturation regions of operation. RF power amplifier 10 may also be a single channel or a multi-channel amplifier or a class AB or class B amplifier. Moreover, RF power amplifier 10 may be a lateral diffusion metal oxide semiconductor (LDMOS) particularly suited to operation in the 500 Megahertz (MHz) to 3.5 Gigahertz (GHz) range typically used in communications systems base terminal stations (BTS). RF power amplifier 10 may also be a GaAs, SiGe, SiC, or GaN semiconductor device.

Predistorter 12 comprises an input loop 18, an output loop 16, and a peak control circuit 70. Input loop 18 comprises magnitude detection circuit 22, LUT 14, complex multiplier 24, real and imaginary circuits 26,28, digital-to-analog converters (DACs) 30, 32, quadrature modulator 34, and RF oscillator 36. Output loop 16 comprises coupler 38, mixer 40, local oscillator 42, amplifier 44, bandpass filter (BPF) 46, intermediate frequency to baseband conversion circuit 48, and processor 52. Peak control circuit 70 comprises threshold detector 72 and power supply 74.

As configured in FIG. 1 input loop 18 accepts an input signal of the type including in-phase and quadrature-phase components I+jQ, referred to herein as a "baseband signal", coupling the signal I+jQ to magnitude detection circuit 22 and complex multiplier 24. Magnitude detection circuit 22 produces a scalar value, e.g., $I^2+Q^2$, representative of a monotonically increasing function of the input power, e.g., power, logarithm of the input power, square root of the input power, etc., of the signal I+jQ that functions as an index to LUT 14.

LUT 14 contains predistortion values, e.g., I", Q", for the in-phase (I) and quadrature-phase (Q) components of signal I+jQ. The initial values in LUT 14 may be determined in one of a number of ways. For example, a calibration routine may be used to determine the transfer characteristics of a particular RF power amplifier, and the initial values in a LUT may be based thereon. Similarly, a particular family or type of RF power amplifiers may be characterized and the initial values in a LUT may be based on such a generalized characterization. Other methods of characterizing the performance of an amplifier and populating a LUT will readily appear to those of skill in the art.

LUT 14 couples the initial predistortion values to complex multiplier 24 where the predistortion values I", Q" are multiplied with signal I+jQ, forming predistorted signal I'+jQ'. Complex multiplier 24 couples the in-phase (I') and quadrature phase (Q') components of predistorted signal I'+jQ', to real (RE( )) and imaginary (IM( )) circuits, as indicated at reference numerals 26 and 28, respectively. Those skilled in the art will appreciate that the separation of the real and imaginary portions of input signal I+jQ may be tradionally done inside complex mixer 24, however, real (RE( )) and imaginary (IM( )) circuits 26, 28 are included for purposes of further illustration should any additional circuitry be necessary in a particular embodiment.

Real and imaginary circuits 26, 28 couple the in-phase (I') and quadrature-phase (Q') components of predistorted signal I'+jQ'to first and second DACs 30, 32, respectively. First and second DACs 30, 32 convert the real (I') and imaginary (Q') portions of the digital signal I'+jQ' to analog signals, coupling the analog signals to quadrature modulator 34.

Quadrature modulator 34, coupled to RF oscillator 36, modulates the analog I' and Q' signals onto a carrier, and couples the carrier to RF power amplifier 10, as indicated by signal A'(t)cos[ω't+θ'(t)]. RF power amplifier 10 amplifies the signal A'(t)cos[ω't+θ'(t)], and has an output signal as indicated at RF OPT. Such an output signal RF OPT may be coupled to an antenna for purposes of communicating a digital in-phase and quadrature-phase signal I+jQ to a wireless device.

Referring now to output loop 16, a portion of the output signal RF OPT of RF power amplifier 10 is coupled by coupler 38 to mixer 40. Coupler 38 is preferably a low loss coupler such that a minimal amount of power is lost in coupling output signal RF OPT to an antenna. Local oscillator 42 is also coupled to mixer 40.

The frequency of local oscillator 42 is selected so that mixer 40 couples an intermodulation distortion product, such as, for example, the third intermodulation distortion ($3^{rd}$ IMD), of RF power amplifier 10 to amplifier 44. Those skilled in the art will appreciate that local oscillator may be tunable in frequency or selected to produce a desired frequency such that one or more of the desired IMD products are selected. Moreover, those skilled in the art will appreciate that in certain embodiments amplifier 44 may not be required.

For example, amplifier 44 amplifies and couples the $3^{rd}$ IMD product of RF power amplifier 10 to BPF 46. BPF 46 frequency selects the $3^{rd}$ IMD product of RF power amplifier 10, coupling the $3^{rd}$ IMD product to intermediate frequency (I/F) to baseband converter circuit 48. I/F to baseband converter circuit 48 produces and couples a digital signal representative of the magnitude of the $3^{rd}$ IMD product to processor 52. Processor 52 selects an optimal set of predistortion values using a gradient search, i.e., comparing successive values of the magnitude of the 3rd IMD product, to minimize the 3rd IMD product and thereby improve the linearity of the response of RF power amplifier 10.

Processor 52 also applies a spline function to update predistortion values in the LUT 14. Those skilled in the art will readily appreciate the application of a spline function. Such application involves analyzing the amplitude to amplitude (AM-AM) and amplitude to phase (AM-PM) predistortion curves, referring to the inputs and outputs of the RF power amplifier 10 respectively, and placing knots along the LUT 14 index to most closely resemble the transfer characteristics of RF power amplifier 10. Those skilled in the art will appreciate that other mathematical functions may be used without departing from the spirit of the present invention.

For RF power amplifier 10, each knot is then varied in magnitude only. For example, during operation, the magnitude of each knot is changed, predistortion values are generated, and the 3rd IMD product is measured to determine whether the change in the magnitude of the knot improved the $3^{rd}$ IMD performance. This process is repeated continuously to improve the spectral purity of RF power amplifier 10.

In other embodiments of the present invention, knot placement along the LUT index may also be varied. In these embodiments, the complexity of the processing performed by a processor, such as processor 52, is essentially doubled. Moreover, in such embodiments, there may exist a subset of knots for which varying the placement along a LUT index may be beneficial.

Those skilled in the art will appreciate that electrical components other than coupler 38, mixer 40, local oscillator 42, amplifier 44, BPF 46, detector 48, ADC 50, and processor 52 may be used as desired to select one or more intermodulation distortion products from the output of a RF power amplifier. Thus, coupler 38, mixer 40, local oscillator 42, amplifier 44, BPF 46, detector 48, ADC 50, and processor 52 are shown for purposes of example and are, therefore, merely exemplary in nature.

Referring now to peak control circuit 70, threshold detector 72 is coupled to magnitude detection circuit 22 and power supply 74. Power supply 74 is coupled to RF power amplifier 10.

Synonymous with the operation of output loop 16 and/or input loop 18, is the operation of power supply control circuit 70. Power supply 74 acts as a voltage supply for RF power amplifier 10, the nominal voltage of which determines, in part, the quiescent operating point or bias of RF power amplifier 10. Threshold detector 72, like LUT 14, receives a monotonically increasing function that is representative of the input power from magnitude detection circuit 22, and uses the function to change or select the voltage of power supply 74 based on the input power.

For example, if RF power amplifier 10 is a LDMOS, power supply 74 may operate at a nominal voltage of 27 volts direct current (DC). However, when the power of the signal I+jQ exceeds a high end set point, or threshold, of threshold detector 72, power supply 74 may switch to 32 volts DC, or perhaps some other advantageous voltage, to provide RF amplifier 10 with the headroom to provide the peak instantaneous power demand by the signal I+jQ without clipping. When the power in the signal I+jQ drops back below the high end threshold, power supply 74 returns to nominal 27 volt DC operation.

In similar manner, threshold detector 72 in peak control circuit 70 may advantageously include a low end threshold configured to reduce the voltage, e.g., 24 volts, of power supply 74 when the power in input signal I+jQ drops below a low end threshold. Such low power operation is particularly useful in increasing the overall capacity of particular communications systems, e.g., code division multiple access (CDMA).

Those skilled in the art will appreciate that other device technologies including, but not limited to, devices using GaAs, SiGe, SiC, and GaN may be used without departing from the spirit of the present invention. Moreover, when using such devices the nominal, the high, and the low power supply voltages, as well as the corresponding high and low thresholds, may be adjusted as required.

Thus, such an embodiment 20 may be thought of as an open loop configuration, being unconditionally stable, the output loop 16 being closed only for purposes of updating predistortion values in LUT 14. Moreover, such an embodiment 20 may be referred to as "adaptive" in that predistortion values in the look-up table change with time. Such an embodiment 20 may also be referred to as "uncorrelated" since the predistortion values that are applied are based on the $3^{rd}$ IMD product of a previous in-phase and quadrature-phase signal, and not the in-phase and quadrature-phase signal the RF power amplifier is about to amplify as in a correlated adaptive predistorter. Those skilled in the art will appreciate, however, that the present invention is also applicable to correlated adaptive predistorter designs that may be used with RF power amplifiers. It will be further appreciated that when using one or more power supply voltages, predistortion values in LUT 14 for RF power amplifier 10 will reflect operation based on those voltages.

Referring now to FIG. 2, a second embodiment 20' of an amplifier system is illustrated. Amplifier system 20' in FIG. 2 is similar to amplifier system 20 in FIG. 1, differing only in the input loop 18'. Therefore, only input loop 18' will be described. Otherwise, as will be appreciated by those skilled in the art, embodiment 20' of FIG. 2 operates in like manner to embodiment 20 of FIG. 1.

Amplifier system 20' comprises an RF power amplifier 10 and a predistorter 12'. Predistorter 12' comprises an input loop 18', an output loop 16, and a peak control circuit 70. Input loop 18' comprises a first converter circuit (I/Q to M/θ) 54, LUT 14', multiplier circuit 56, adder circuit 58, a second converter circuit (M'/θ' to I'/Q') 60, digital-to-analog converters (DACs) 30, 32, quadrature modulator 34, and RF oscillator 36.

As configured in FIG. 2 input loop 18' accepts an input signal of the type including in-phase and quadrature-phase components I+jQ, coupling the signal I+jQ to first converter circuit (I/Q to M/θ) 54. First converter circuit (I/Q to M/θ) 54 converts signal I+jQ into magnitude M and phase θ components. Magnitude component M is coupled to multiplier circuit 56, LUT 14', and threshold detector 72. Phase component θ is coupled to adder circuit 58. Magnitude component M functions as a scalar value representative of the power of the baseband signal I+jQ, and indexes LUT 14'.

LUT 14' contains predistortion values G, Φ for the magnitude and phase components M, θ, respectively, of baseband signal I+jQ. LUT 14' couples predistortion values G, Φ to multiplier circuit 56 and adder circuit 58, respectively, where the predistortion values G, Φ are combined with the magnitude and phase components M, θ of signal I+jQ, forming predistorted magnitude and phase components M', θ'.

Multiplier circuit 56 and adder circuit 58 couple the predistorted magnitude and phase components M', θ' to second converter circuit (M'/θ' to I'/Q') 60. Second converter circuit (M'/θ' to I'/Q') 60 converts the predistorted magnitude and phase components M', θ' to in-phase I' and quadrature-phase Q' components of predistorted signal I'+jQ'. The in-phase I' and quadrature-phase Q' components are coupled to real (RE( )) and imaginary (IMO) circuits 26, 28, respectively. Those skilled in the art will appreciate that the separation of the real and imaginary portions of input signal I+jQ may be traditionally done inside second converter circuit 60, however, real (RE( )) and imaginary (IM( )) circuits 26, 28 are included for purposes of further illustration should any additional circuitry be necessary for separation in a particular embodiment.

The remaining elements, i.e., first and second DACs 30, 32, quadrature modulator 34, and RF oscillator 36, of input loop 18' illustrated in FIG. 2 operate in like manner to that of input loop 18 of FIG. 1.

As will be appreciated by those skilled in that art, both amplifier system 20 of FIG. 1 and amplifier system 20' of FIG. 2 operate on a baseband input signal including in-phase and quadrature-phase components. However, amplifier system 20 differs from amplifier system 20' in that input loop 18 of FIG. 1 operates on the input signal in rectangular form (I/Q), whereas input loop 18' of FIG. 2 operates on the input signal in polar form (M, θ). Thus, the present invention does not rely on processing an input signal in any particular form.

Referring now to FIG. 3, a third embodiment 20" of an amplifier system is illustrated. Amplifier system 20" in FIG. 3 is similar to amplifier systems 20 and 20' in FIGS. 1 and 2, differing only in the input loop 18". Therefore, only input loop 18" is described. Embodiment 20" of FIG. 3 operates in like manner to the embodiments 20, 20' of FIGS. 1 and 2 otherwise.

Amplifier system 20" comprises an RF power amplifier 10 and a predistorter 12". Predistorter 12" comprises an input loop 18", an output loop 16, and a peak control circuit 70. Input loop 18" comprises delay circuit 62, envelope detector circuit 64, analog-to-digital converter (ADC) 66, complex attenuator 68, and LUT 14".

As configured in FIG. 1 input loop 18 accepts an input signal of the type including in-phase and quadrature-phase components I+jQ, referred to herein as a "baseband signal", coupling the signal I+jQ to envelope detection circuit 22 and complex multiplier 24.

Input loop 18" accepts a modulated RF signal of the type A(t)cos[ω(t)+θ(t)]. Signal A(t)cos[ωt+θ(t)] is coupled to delay circuit 62 and envelope detector circuit 64. Envelope detector circuit 64 produces a scalar value A(t) representative of the power of signal A(t)cos[ω(t)+θ(t)]. Those skilled in the art will appreciate that a diode is one example of an envelope detection circuit 64. Envelope detector circuit 64 is coupled to ADC 66 and threshold detector 72. ADC 66 converts scalar value A(t) to a digital signal that functions as an index to LUT 14".

LUT 14" contains predistortion values for the magnitude and phase components of input signal A(t)cos[ω(t)+θ(t)]. LUT 14" couples the predistortion values to complex attenuator 68 wherein the predistortion values effect the magnitude and phase components of input signal A(t)cos[ω(t)+θ(t)], forming predistorted signal A'(t)cos[ω'(t)+θ'(t)]. Delay circuit 62 allows enough time for detection and conversion such that signal A(t)cos[ω(t)+θ(t)] is coupled to the complex attenuator 68 at the same time as the predistiortion values. Complex attenuator 68 couples the predistorted signal A'(t)cos[ω'(t)+θ'(t)] to RF power amplifier 10.

It will be apparent to those skilled in the art that a power attenuator combined with a phase shifter may function as a complex attenuator. Further, it will also be apparent to those skilled in the art that a vector modulator may be used as a complex attenuator.

As will be appreciated by those skilled in that art, amplifier system 20" of FIG. 3 operates on a sinusoidal or RF based input signal. Thus, unlike input loop 18 of FIG. 1 and input loop 18' of FIG. 2 that operate on an input signal in rectangular form (I/Q) and polar form (M, θ), respectively, input loop 18" operates on a sinusoidal signal. Thus, the present invention is not limited in the form of input signal used.

While the present invention has been illustrated by the description of the embodiments thereof, and while the embodiments have been described in considerable detail, it is not the intention of the applicants to restrict or in any way limit the scope of the appended claims to such detail. For example, it will be understood that a signal input to an uncorrelated adaptive predistorter may take any one of several forms, including but not limited to the types I+jQ and A(t)cos[ω(t)+θ(t)], representing in-phase and quadrature-phase components and a modulated carrier signal, respectively. Moreover, an input loop 18, 18', 18" may be configured accordingly to accommodate such signals. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicants' general inventive concept.

What is claimed is:

1. A predistorter configured for use with an RF power amplifier, the predistorter comprising:

an input loop configured to be coupled to the input of an RF power amplifier, the input loop including a look-up table containing predistortion values, the input loop configured to apply the predistortion values to an input signal, in response to a monotonically increasing function of the input signal power, for forming a predistorted input signal;

a peak control circuit coupled to the input loop, the peak control circuit configured to select a power supply voltage for the RF power amplifier in response to the power in the input signal; and an output loop coupled to the output of the RF power amplifier, the output loop tunable to frequency select a portion of a frequency band and measure an intermodulation distortion product of the RF power amplifier output resulting from the predistorted input signal and disposed in the selected portion of the frequency band, the output loop operable to update the predistortion values in the look-up table responsive to the measured intermodulation distortion product.

2. The predisorter of claim 1, wherein the monotonically increasing function of the input signal power includes at least one of the input power, the logarithm of the input power, and the square root of the input power.

3. The predistorter of claim 1, wherein the intermodulation distortion product is at least one of the third and the fifth intermodulation distortion products.

4. The predistorter of claim 1, wherein the output loop comprises:

a coupler coupled to the output of the RF power amplifier;

a mixer coupled to the coupler;

a local oscillator coupled to the mixer and configured to output a frequency so that the mixer selects at least one of the third and the fifth intermodulation distortion products of the RE power amplifier;

an amplifier coupled to the mixer and configured to amplify at least one of the third and the fifth intermodulation distortion products;

a bandpass filter coupled to the amplifier and configured to frequency select at least one of the third and the fifth intermodulation distortion products;

an intermediate frequency to baseband converter circuit coupled to the bandpass filter and configured to produce a digital signal representative of the magnitude of at least one of the third and the fifth intermodulation distortion products; and a processor coupled to the intermediate frequency to baseband converter circuit and the look-up table and configured to select an optimal set of predistortion values.

5. The predistorter of claim 1, wherein the output loop comprises a processor, the processor configured to select an optimal set of predistortion values using a gradient search.

6. The predistorter of claim 1, wherein the output loop comprises a processor, the processor configured to apply a spline function to update predistortion values in the look-up table.

7. The predistorter of claim 6, wherein the application of the spline function involves analyzing amplitude to amplitude and amplitude to phase predistortion curves.

8. The predistorter of claim 6, wherein the spline function has knots and wherein the application of the spline function involves varying the magnitude of each knot, generating predistortion values, and measuring an intermodulation distortion product to determine whether the change in the magnitude of the knot improved the intermodulation distortion performance.

9. The predistorter of claim 6, wherein the look-up table has an index and the spline function includes knots that are place along the look-up table index; and, wherein knot placement along the look-up table index is varied.

10. The predistorter of claim 1, wherein the input signal is of the type of at least one of I+jQ and A(t)cos[ωt+θ(t)].

11. The predistorter of claim 1, wherein the input signal is of the type I+jQ, the predistortion values in the look-up table are in in-phase and quadrature-phase form, and the input loop comprises:

a magnitude detection circuit coupled to the look-up table and configured to produce a scalar value representative of the power of the input signal, the scalar value functioning as an index to the look-up table;

a complex multiplier coupled to the look-up table and configured to combine predistortion values in the look-up table with the input signal and output a predistortion signal;

first and second digital-to-analog converters coupled to the complex multiplier and configured to convert the predistortion signal from a digital signal to analog signals;

quadrature modulator coupled to the first and second digital-to-analog converters and configured to apply the analog signals to a carrier signal; and an RF oscillator coupled to the quadrature modulator and configured to provide a carrier signal.

12. The predistorter of claim 1, wherein the input signal is of the type I+jQ, the predistortion values in the look-up table are in the form of magnitude and phase, and the input loop comprises:

a first converter circuit coupled to the look-up table and configured to convert the input signal into magnitude and phase form, the magnitude functioning as an index to the look-up table;

a multiplier circuit coupled to the first converter circuit and the look-up table, the multiplier circuit configured to combine a magnitude predistortion value in the look-up table with the magnitude of input signal;

an adder circuit coupled to the first converter circuit and the look-up table, the adder circuit configured to combine a phase predistortion value in the look-up table with the phase of input signal;

a second converter circuit coupler the multiplier circuit and the adder circuit and configured to output a predistortion signal;

first and second digital-to-analog converters coupled to the second converter circuit and configured to convert the predistortion signal from a digital signal to analog signals;

a quadrature modulator coupled to the first and second of digital-to-analog converters and configured to apply the analog signals to a carrier signal; and an RF oscillator coupled to the quadrature modulator and configured to provide a carrier signal.

13. The predistorter of claim 1, wherein the input signal is of the type A(t)cos[ωt+θ(t)], the predistortion values in the look-up table are in the form of magnitude and phase, and the input loop comprises:

an envelope detection circuit coupled to the look-up table and configured to produce a scalar value representative of the power of the input signal;

an analog-to-digital converter circuit coupled to the detector circuit and the look-up table, the analog-to-digital converter circuit configured to convert the scalar value to a digital signal that functions as an index to the look-up table;

a complex attenuator coupled to the look-up table and configured to combine predistortion values in the look-up table with the input signal; and a delay circuit coupled to the complex attenuator and configured to delay the application of the input signal to the complex attenuator.

14. The predistorter of claim 13, wherein the complex attenuator comprises:

a power attenuator; and a phase shifter.

15. The predistorter of claim 13, wherein the complex attenuator comprises a vector modulator.

16. The predistorter of claim 1, wherein the peak control circuit comprises:

a threshold detector configured with at least one of a high power threshold and a low power threshold; and, a power supply having a nominal voltage and a selectable voltage based on at least one of the high power threshold and the low power threshold.

17. An amplifier system comprising an RF power amplifier and a predistorter, the predistorter comprising:

an input loop configured to be coupled to the input of an RF power amplifier, the input loop including a look-up table containing predistortion values, the input loop configured to apply the predistortion values to an input signal, in response to a monotonically increasing function of the input signal power, for forming a predistorted input signal;

a peak control circuit coupled to the input loop, the peak control circuit configured to select a power supply voltage for the RF power amplifier in response to the power in the input signal; and an output loop coupled to the output of the RF power amplifier, the output loop tunable to frequency select a portion of a frequency band and measure an intermodulation distortion product of the RF power amplifier output resulting from the predistorted input signal and disposed in the selected portion of the frequency band, the output loop operable to update the predistortion values in the look-up table responsive to the measured intermodulation distortion product.

18. The amplifier system of claim 17, wherein the monotonically increasing function of the input signal power includes at least one of the input power, the logarithm of the input power, and the square root of the input power.

19. The amplifier system of claim 17, wherein the intermodulation distortion product is at least one of the third and the fifth intermodulation distortion products.

20. The amplifier system of claim 17, wherein the output loop comprises:

a coupler coupled to the output of the RF power amplifier;

a mixer coupled to the coupler;

a local oscillator coupled to the mixer and configured to output a frequency so that the mixer selects at least one of the third and the fifth intermodulation distortion products of the RF power amplifier;

an amplifier coupled to the mixer and configured to amplify at least one of the third and the fifth intermodulation distortion products;

a bandpass filter coupled to the amplifier and configured to frequency select at least one of the third and the fifth intermodulation distortion products;

an intermediate frequency to baseband converter circuit coupled to the bandpass filter and configured to produce a digital signal representative of the magnitude of at least one of the third and the fifth intermodulation distortion products; and a processor coupled to the intermediate frequency to baseband converter circuit and the look-up table and configured to select an optimal set of predistortion values.

21. The amplifier system of claim 17, wherein the output loop comprises a processor, the processor configured to select an optimal set of predistortion values using a gradient search.

22. The amplifier system of claim 17, wherein the output loop comprises a processor, the processor configured to apply a spline function to update predistortion values in the look-up table.

23. The amplifier system of claim 22, wherein the application of the spline function involves analyzing amplitude to amplitude and amplitude to phase predistortion curves.

24. The amplifier system of claim 22, wherein the spline function has knots and wherein the application of the spline function involves varying the magnitude of each knot, generating predistortion values, and measuring an intermodulation distortion product to determine whether the change in the magnitude of the knot improved the intermodulation distortion performance.

25. The amplifier system of claim 22, wherein the look-up table has an index and the spline function includes knots that are place along the look-up table index; and, wherein knot placement along the look-up table index is varied.

26. The amplifier system of claim 17, wherein the input signal is of the type of at least one of I+jQ and $A(t)\cos[\omega t+\theta(t)]$.

27. The amplifier system of claim 17, wherein the input signal is of the type I+jQ, the predistortion values in the look-up table are in in-phase and quadrature-phase form, and the input loop comprises:
   a magnitude detection circuit coupled to the look-up table and configured to produce a scalar value representative of the power of the input signal, the scalar value functioning as an index to the look-up table;
   a complex multiplier coupled to the look-up table and configured to combine predistortion values in the look-up table with the input signal and output a predistortion signal;
   first and second digital-to-analog converters coupled to the complex multiplier and configured to convert the predistortion signal from a digital signal to analog signals;
   a quadrature modulator coupled to the first and second digital-to-analog converters and configured to apply the analog signals to a carrier signal; and
   an RF oscillator coupled to the quadrature modulator and configured to provide a carrier signal.

28. The amplifier system of claim 17, wherein the input signal is of the type I+jQ, the predistortion values in the look-up table are in the form of magnitude and phase, and the input loop comprises:
   a first converter circuit coupled to the look-up table and configured to convert the input signal into magnitude and phase form, the magnitude functioning as an index to the look-up table;
   a multiplier circuit coupled to the first converter circuit and the look-up table, the multiplier circuit configured to combine a magnitude predistortion value in the look-up table with the magnitude of input signal;
   an adder circuit coupled to the first converter circuit and the look-up table, the adder circuit configured to combine a phase predistortion value in the look-up table with the phase of input signal;
   a second converter circuit coupler the multiplier circuit and the adder circuit and configured to output a predistortion signal;
   first and second digital-to-analog converters coupled to the second converter circuit and configured to convert the predistortion signal from a digital signal to analog signals;
   a quadrature modulator coupled to the first and second digital-to-analog converters and configured to apply the analog signals to a carrier signal; and
   an RF oscillator coupled to the quadrature modulator and configured to provide a carrier signal.

29. The amplifier system of claim 17, wherein the input signal is of the type $A(t)\cos[\omega t+\theta(t)]$, the predistortion values in the look-up table are in the form of magnitude and phase, and the input loop comprises:
   an envelope detection circuit coupled to the look-up table and configured to produce a scalar value representative of the power of the input signal;
   an analog-to-digital Converter circuit coupled to the envelope detection circuit and the look-up table, the analog-to-digital converter circuit configured to convert the scalar value to a digital signal that functions as an index to the look-up table;
   a complex attenuator coupled to the look-up table and configured to combine predistortion values in the look-up table with the input signal; and
   a delay circuit coupled to the complex attenuator and configured to delay the application of the input signal to the complex attenuator.

30. The amplifier system of claim 29, wherein the complex attenuator comprises:
   a power attenuator; and
   a phase shifter.

31. The amplifier system of claim 29, wherein the complex attenuator comprises a vector modulator.

32. The amplifier system of claim 17, wherein the peak control circuit comprises:
   a threshold detector configured with at least one of a high power threshold and a low power threshold; and
   a power supply having a nominal voltage and a selectable voltage based on at least one of the high power threshold and the low power threshold.

33. A method of predistorting an input signal applied to an RF power amplifier, the method comprising:
   producing a scalar value representative of the power of the input signal;
   applying the scalar value to index a look-up table containing predistortion values;
   combining the predistortion values with the input signal to improve the linearity of the RF power amplifier;
   applying the scalar to a threshold to select a power supply voltage for the RF power amplifier; and
   frequency selecting a portion of a frequency band for an output of the RF power amplifier using a tunable output loop and measuring an intermodulation distortion product disposed in the selected portion of the frequency band for the output of the RF power amplifier to select optimal predistortion values based upon the measured intermodulation distortion product.

34. The method of claim 33, wherein the intermodulation distortion product is at least one of the third and the fifth intermodulation distortion products.

35. The method of claim 33, wherein the optimal predistortion values are selected using a gradient search.

36. The method of claim 35, further comprising updating the predistortion values in the table.

37. The method of claim 35, wherein the predistortion values are updated by applying a spline function to the amplitude to amplitude and amplitude to phase characteristics of the RF power amplifier.

38. The method of claim 35, wherein the spline function has knots, and wherein the application of the spline function involves varying the magnitude of each knot, generating predistortion values, and measuring an intermodulation distortion product to determine whether the change in the magnitude of the knot improved the intermodulation distortion performance.

39. The method of claim 35, wherein the spline function includes knots that are placed along the look-up table index; and, wherein knot placement along the look-up table index is varied.

40. The predistorter of claim 1, wherein the output loop comprises:
   a filter coupled to the output of the RF power amplifier and configured to frequency select the selected portion of the frequency band;
   an intermediate frequency to baseband converter circuit coupled to the filter and configured to produce a digital signal representative of the magnitude of the intermodulation distortion product in the selected portion of the frequency band; and a processor coupled to the intermediate frequency to baseband converter circuit and the look-up table and configured to select an optimal set of predistortion values.

41. The predistorter of claim 40, wherein the filter is a bandpass filter, and wherein the output loop further comprises:

a coupler coupled to the output of the RF power amplifier;
a mixer coupled to the coupler;
a tunable local oscillator coupled to the mixer and configured to output a frequency so that the mixer selects the selected portion of the frequency band; and
an amplifier coupled to the mixer and configured to amplify the selected portion of the frequency band;

wherein the coupler, mixer, tunable oscillator and amplifier and coupled intermediate the RF power amplifier and the bandpass filter.

42. The amplifier system of claim 17, wherein the output loop comprises:

a filter coupled to the output of the RF power amplifier and configured to frequency select the selected portion of the frequency band;
an intermediate frequency to baseband converter circuit coupled to the filter and configured to produce a digital signal representative of the magnitude of the intermodulation distortion product in the selected portion of the frequency band; and
a processor coupled to the intermediate frequency to baseband converter circuit and the look-up table and configured to select an optimal set of predistortion values.

43. The amplifier system of claim 42, wherein the filter is a bandpass filter, and wherein the output loop further comprises:

a coupler coupled to the output of the RF power amplifier;
a mixer coupled to the coupler;
a tunable local oscillator coupled to the mixer and configured to output a frequency so that the mixer selects the selected portion of the frequency band; and
an amplifier coupled to the mixer and configured to amplify the selected portion of the frequency band;

wherein the coupler, mixer, tunable oscillator and amplifier and coupled intermediate the RF power amplifier and the bandpass filter.

44. A predistorter configured for use with an RF power amplifier, the predistorter comprising:

an input loop configured to be coupled to the input of an RF power amplifier, the input loop including a look-up table containing predistortion values, the input loop configured to apply the predistortion values to an input signal, in response to a monotonically increasing function of the input signal power, for forming a predistorted input signal;
a peak control circuit coupled to the input loop, the peak control circuit configured to select a power supply voltage for the RF power amplifier in response to the power in the input signal; and
an output loop coupled to the output of the RF power amplifier, the output loop configured to measure an intermodulation distortion product of the RF power amplifier output resulting from the predistorted input signal, the output loop operable to update the predistortion values in the look-up table responsive to the measured intermodulation distortion product, wherein the output loop comprises:
a coupler coupled to the output of the RF power amplifier;
a mixer coupled to the coupler;
a local oscillator coupled to the mixer and configured to output a frequency so that the mixer selects at least one of the third and the fifth intermodulation distortion products of the RF power amplifier;
an amplifier coupled to the mixer and configured to amplify at least one of the third and the fifth intermodulation distortion products;
a bandpass filter coupled to the amplifier and configured to frequency select at least one of the third and the fifth intermodulation distortion products;
an intermediate frequency to baseband converter circuit coupled to the bandpass filter and configured to produce a digital signal representative of the magnitude of at least one of the third and the fifth intermodulation distortion products; and
a processor coupled to the intermediate frequency to baseband converter circuit and the look-up table and configured to select an optimal set of predistortion values.

45. An amplifier system comprising an RF power amplifier and a predistorter, the predistorter comprising:

an input loop configured to be coupled to the input of an RF power amplifier, the input loop including a look-up table containing predistortion values, the input loop configured to apply the predistortion values to an input signal, in response to a monotonically increasing function of the input signal power, for forming a predistorted input signal;
a peak control circuit coupled to the input loop, the peak control circuit configured to select a power supply voltage for the RF power amplifier in response to the power in the input signal; and
an output loop coupled to the output of the RF power amplifier, the output loop configured to measure an intermodulation distortion product of the RF power amplifier output resulting from the predistorted input signal, the output loop operable to update the predistortion values in the look-up table responsive to the measured intermodulation distortion product, wherein the output loop comprises:
a coupler coupled to the output of the RF power amplifier;
a mixer coupled to the coupler;
a local oscillator coupled to the mixer and configured to output a frequency so that the mixer selects at least one of the third and the fifth intermodulation distortion products of the RF power amplifier;
an amplifier coupled to the mixer and configured to amplify at least one of the third and the fifth intermodulation distortion products;
a bandpass filter coupled to the amplifier and configured to frequency select at least one of the third and the fifth intermodulation distortion products;
an intermediate frequency to baseband converter circuit coupled to the bandpass filter and configured to produce a digital signal representative of the magnitude of at least one of the third and the fifth intermodulation distortion products; and
a processor coupled to the intermediate frequency to baseband converter circuit and the look-up table and configured to select an optimal set of predistortion values.

* * * * *